United States Patent [19]

Arakawa et al.

[11] Patent Number: 5,061,990
[45] Date of Patent: Oct. 29, 1991

[54] SEMICONDUCTOR DEVICE AND THE MANUFACTURE THEREOF

[75] Inventors: Ryutaro Arakawa; Sunao Fukutake, both of Ibaraki, Japan

[73] Assignee: Hitachi Maxell, Ltd., Osaka, Japan

[21] Appl. No.: 246,749

[22] Filed: Sep. 20, 1988

[30] Foreign Application Priority Data

Sep. 21, 1987 [JP] Japan ................................. 62-236891

[51] Int. Cl.⁵ ...................... H01L 39/02; H05K 1/14; H01R 9/00
[52] U.S. Cl. ........................................ 357/80; 357/72; 357/75; 357/81; 361/395; 361/400; 361/405; 361/412; 361/413
[58] Field of Search ...................... 357/72, 75, 80, 81; 361/395, 412, 413, 400, 405

[56] References Cited

U.S. PATENT DOCUMENTS 4,761,881 8/1988 Bora et al. ............................ 361/400
4,949,224 8/1990 Yamamura et al. ................. 361/412

Primary Examiner—Edward J. Wojciechowicz
Attorney, Agent, or Firm—Birch, Stewart, Kolasch & Birch

[57] ABSTRACT

A semiconductor device comprising: a wiring board having terminals; a sheet module including a sheet having a plurality of connection terminals and lead terminals, each connected to at least one of said connection terminals at one end and to one of the terminals of the board at the other end; a plurality of TAB-packaged IC devices, each having outer leads which are bonded to at least some of said connection terminals to mount the IC device on the sheet and to connect the IC device to the terminal of the wiring board, a method of manufacturing a semiconductor device comprising: the step including coating a metal layer on each of the front and the rear surfaces of a tape, forming through holes which make conduction between the front surface and the rear surface, etching the metal layers to leave a plurality of connection terminals connected to said through holes and lead terminals each connected to at least one of said plurality of connection terminals, subjecting portions other than the connection terminals and the lead terminals to insulation treatment, and forming a metal coating on arears not provided with the insulation treatment; the step of forming a module including preparing a plurality of TAB-packaged IC devices having outer leads, and bonding the outer leads of said plurality of IC devices to said connection terminals to mount the IC devices on the tape; and the step including cutting said module from said tape, and connecting said lead terminals to the terminals of a circuit board to mount the module on the circuit board.

8 Claims, 4 Drawing Sheets

SEMICONDUCTOR DEVICE AND THE MANUFACTURE THEREOF

BACKGROUND OF THE INVENTION

This invention relates to a semiconductor device, and more particularly to an improvement in the semiconductor device employing an IC chip assembled through wireless bonding of the tape automated bonding (TAB) method and capable of realizing compact and high density packaging.

According to a conventional semiconductor device assembled through the TAB method, as shown in FIGS. 1A and 1B, chip leads 9 formed on a tape film and the associated gold Au bumps 10 formed on aluminium pads on an IC chip 8 are bonded by thermo-compression. Then, the active surface of the IC chip 8 is coated with resin 11, by contacting the surface to the support tape 12 and/or covering the surface with the resin 11.

The IC chip thus mounted on a tape carrier 20 is cut off from the carrier 20 at lines X—X' and Y—Y' in FIG. 1A, to constitute a TAB packaged IC device 19.

FIG. 1B shows a plan view of the tape carrying the IC chips and also illustrates the position of cut lines X—X' and Y—Y'.

The chip leads 9 are appropriately bent or formed and bonded to a printed circuit board 15, as shown in FIG. 2. Namely, the outer portions of the chip leads 9 are bonded to bonding terminals 14 at outer bonding portions 13. In this way, a semiconductor IC device 19 is mounted and packaged on a circuit board 15.

According to such a structure as shown in FIG. 2, usually only one layer of IC devices can be packaged on one side of the printed circuit board 15. When a multiplicity of ICs are to be packaged on a printed wiring board, the wiring on the board become complicated and hence the number of layers needed in the printed wiring board 15 should increase correspondingly. When the memory capacity of such module as a whole, including a printed wiring board 15 and TAB-packaged, memory IC devices 19, is to be increased, the number of memory IC devices 19 to be mounted on the wiring board 15 should be increased provided that the capacity (area) of each IC device is the same.

Then, a certain number of ICs 19 applied in the flexible tape 1 by TAB method are detached, two to four for instance, and bonded on the surface of the circuit board, as shown in the FIG. 3.

As a result, the occupation area of the memory IC devices 19 on the circuit board increases. It becomes difficult to make the size compact and the memory capacity large. In the figures, reference numeral 13 denotes an outer lead bonding portion, 14 a bonding terminal, and 16 a through hole.

SUMMARY OF THE INVENTION

This invention is directed to solving the problem of the prior art that IC chips can only be mounted in a single layer on one side of a printed circuit board and when a multiplicity of IC chips are mounted, the wiring patterns become complicated, and the surface area needed for packaging increases.

An object of this invention is to provide a compact semiconductor device capable of achieving high density packaging.

Another object of this invention is to provide a method of manufacturing a semiconductor device with a multi-layer structure circuit board.

According to an aspect of this invention, there is provided a semiconductor device comprising:
a wiring board having terminals;
a sheet module including a sheet having a plurality of connection terminals and sheet leader, each connected to at least one of said connection terminals at one end and to one of the terminals of the board at the other end;
a plurality of TAB-packaged IC devices, each having outer leads which are bonded to at least some of said connection terminals to mount the IC device on the sheet and to connect the IC device to the terminal of the wiring board.

According to another aspect of the invention, there is provided a method of manufacturing a semiconductor device comprising:

the step including coating a metal layer on each of the front and the rear surfaces of a tape, forming through holes for electrical conduction between the front surface and the rear surface, etching the metal layers to leave a plurality of connection terminals connected to the through holes and sheets leads each connected to at least one of the plurality of connection terminals, subjecting portions other than the connection terminals and the sheet leads to insulation treatment, and forming a metal coating on areas not provided with the insulation treatment;

the step of forming a module including preparing a plurality of TAB-packaged IC devices having outer leads, and bonding the outer leads of the plurality of IC devices to the connection terminals to mount the IC devices on the tape; and the step including cutting said module from said tape, and connecting the sheet leads to the terminals of a circuit board to mount the module on the circuit board.

For example, metal foils are laminated on both the surfaces of a tape made of polyimide, etc. and having a thickness of the order of 100 μm using an adhesive agent. Then, holes are bored and plating is done where electrical conduction is to be established between the front surface and the rear surface, to complete the through holes. Photo-etching is done to leave connection terminals, sheet leads, and wiring patterns on the two surfaces of the tape. Then, insulation treatment is performed by coating a resist film of a thickness of about 20 μm on the areas other than the connection terminals and the sheet leads formed of metal foils. A layer of Au or Sn, or Pb-Sn, etc. is formed by plating on the areas not provided with the insulation treatment, to manufacture a long-sized tape.

A plurality of IC chips which have been subjected to the inner lead bonding by the TAB method are outer-lead-bonded to both surfaces of the long-sized tape. A tape or sheet module mounting a plurality of IC chips is cut off at a predetermined position of the outer sheet leads, and is outer-lead-bonded to a printed circuit board of the semiconductor device. In this way, a semiconductor device packaging IC chips in multi-layers on one surface of the printed circuit board is completed.

Thus, when a module packaging a plurality of IC chips on a substrate of a film or a sheet such as a tape, etc. is formed, and such a tape module is packaged on a circuit board, a multiplicity of IC chips can be packaged on a circuit board at a high density and also the step of packaging the circuit board becomes easy.

Further, since wirings can be made in the tape module itself, wirings in the circuit board become simple.

DESCRIPTION OF THE PREFERRED EMBODIMENTS

Figure 1A:
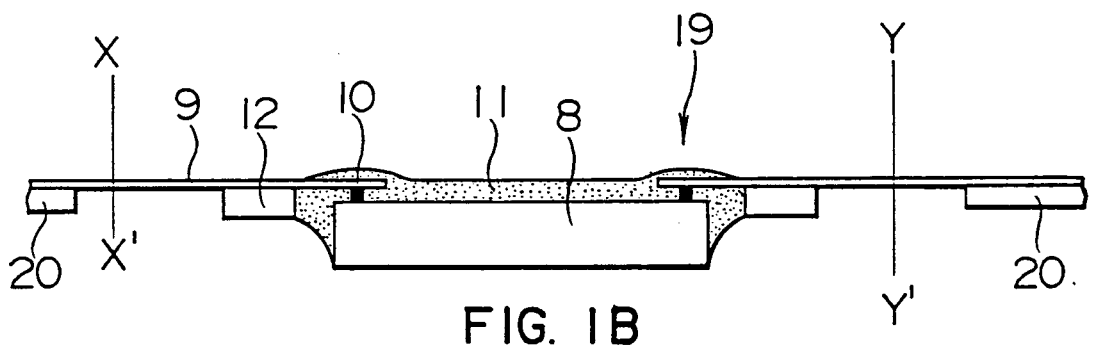
FIGS. 1A and 1B are, respectively, a cross-section showing an IC packaged by the TAB method, and a plan view illustrating a carrier tape.

Now, an embodiment of this invention will be described in detail referring to the drawings.

Figure 4:
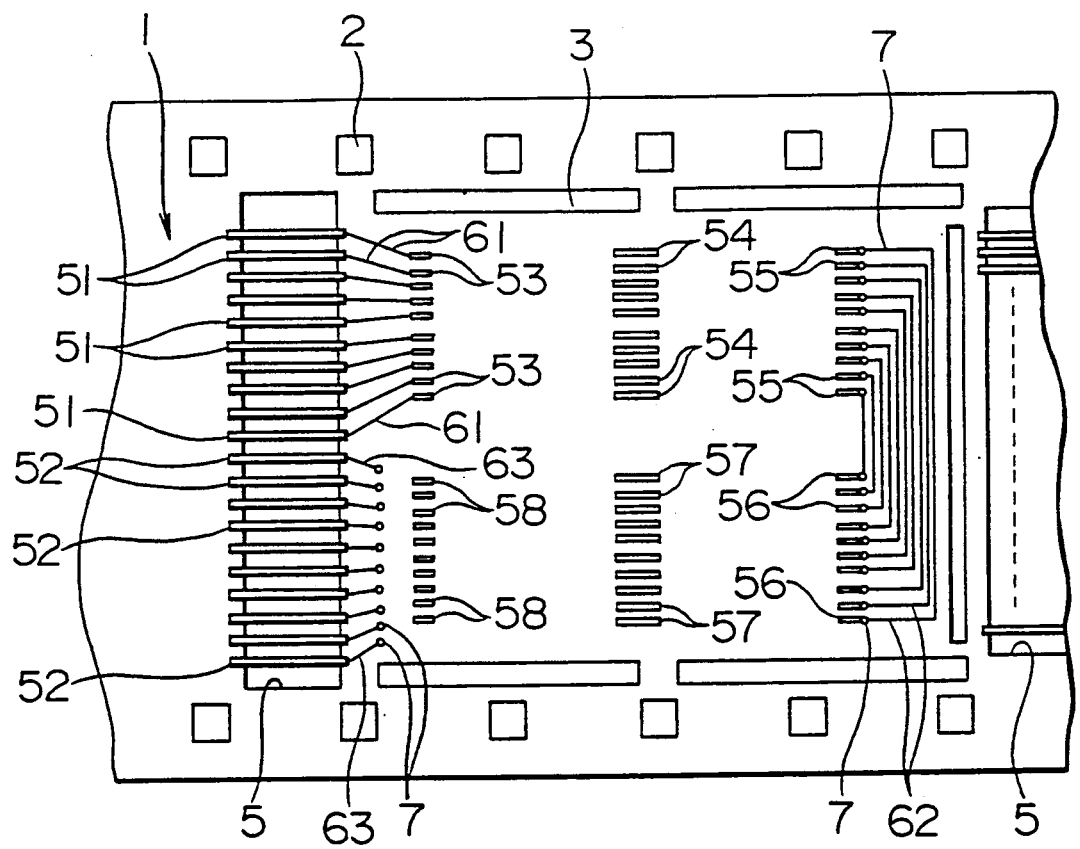
FIG. 4 is a plan view showing an embodiment of the semiconductor device according to this invention.
Figure 5:
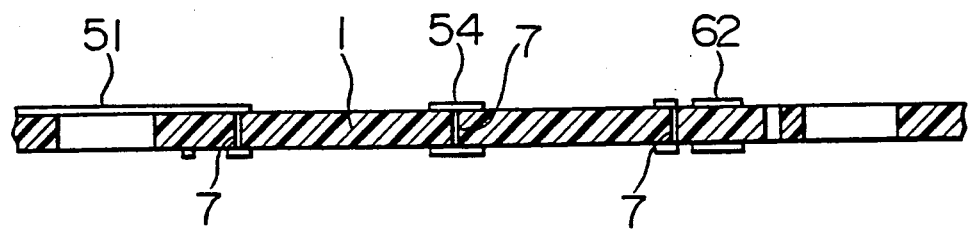
FIG. 5 is a cross-section of the structure of FIG. 4.
Figure 6:
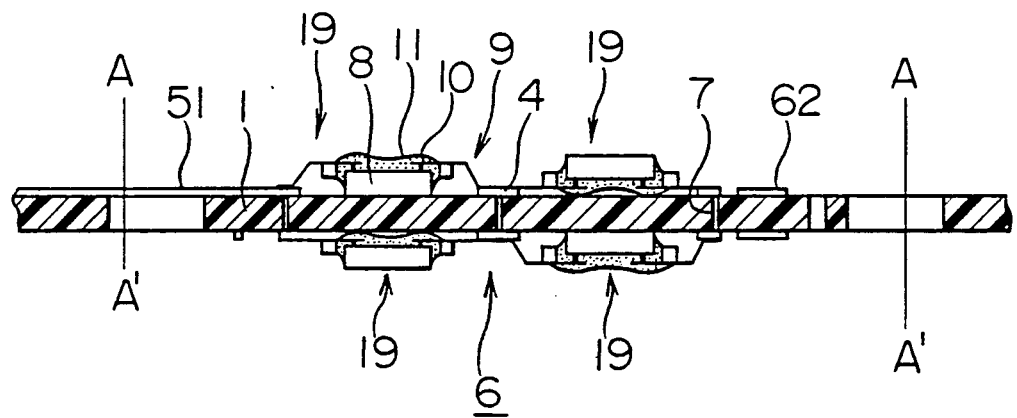
FIG. 6 is a cross-section of a structure where the structure of FIG. 5 packages TAB-packaged IC devices.
Figure 7:
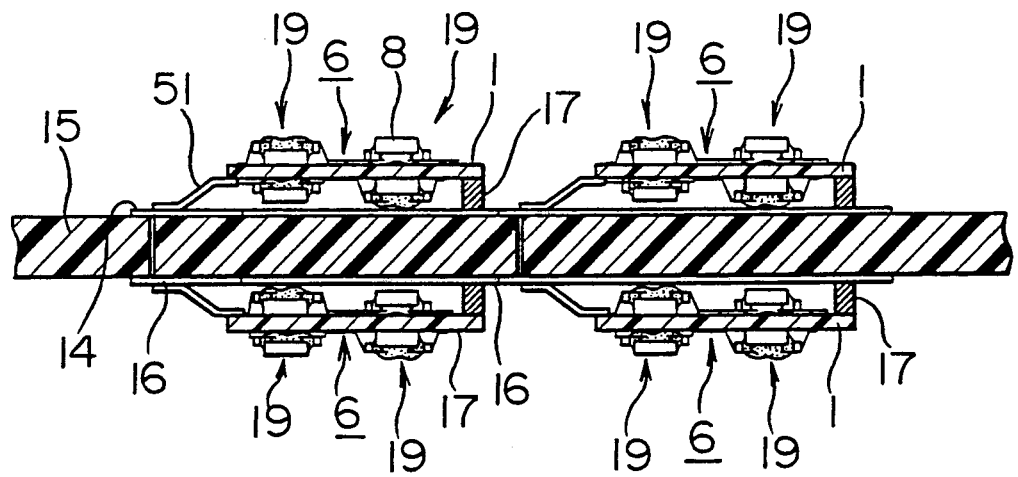
FIG. 7 is a cross-section of a device where modules of FIG. 6 packaging TAB-packaged IC devices are packaged on a printed circuit board.

FIG. 4 is a plan view of a tape structure for illustrating an embodiment of the semiconductor device of this invention. FIG. 5 is a cross-section of the tape structure of FIG. 4. FIG. 6 is a cross-section of a module in which TAB-packaged devices are mounted or packaged on the tape structure of FIG. 5. FIG. 7 is a cross-section of a printed circuit board in which the modules of FIG. 6 each carrying TAB-packaged IC devices are mounted or packaged on a printed circuit board. In the figures, similar parts are denoted by similar symbols.

In FIG. 4, numeral 1 denotes a flexible tape made of polyimide, glass epoxy resin, etc. and having a thickness of the order of 18 $\mu$m~125 $\mu$m, to be used in the TAB packaging. In this flexible tape 1, there are provided sprocket holes 2 for feeding the tape 1, apertures 3 to be used for punching, and an aperture 5 located under sheet leads 51 and 52 for cutting away a module from the tape 1.

Numerals 51, 51, ..., 52, 52, ... represent sheet leads and 53, 53, ..., 54, 54, ..., 55, 55, ..., 56, 56, ..., 57, 57, ..., 58, 58, ... connection terminals for ICs to be mounted on the tape. These connection terminals 53, 54, 55, 56, 57 and 58 are formed on both the front and the rear surfaces of the flexible tape 1 at the registered positions. Numerals 61, 61, ... represent wiring patterns which respectively connect the sheet leads 51, 51, ... with connection terminals 53, 53, ... Numerals 62, 62, ... represent wiring patterns which respectively connect the connection terminals 55, 55, ... with the connection terminals 56, 56, ... These wiring patterns are provided on both the front and the rear surfaces of the flexible tape 1 at the registered positions. Also, numerals 63, 63, ... represent wiring patterns which respectively interconnects the sheet leads 52, 52, ... with through holes 7.

As shown in FIG. 5, the through holes 7 are formed to penetrate through the flexible tape 1 respectively between the connection terminals 53, 54, 55, 56, 57 and 58 on the front and the rear surfaces. Each pair of the corresponding connection terminals provided on the front and the rear surfaces are connected to each other through an associated through hole 7. The sheet leads 52 are electrically connected to the connection terminals on the rear surface through the through holes 7. Such a flexible tape 1 as described above may be made by punching sprocket holes 2, apertures 3 for punching, apertures 5 located beneath the sheet leads 51 and 52 for cutting a module away from the tape 1 in a flexible tape made of polyimide, glass-epoxy resin, etc. and having a thickness of the order of 18~125 $\mu$m, and by laminating copper (Cu) foils of a thickness 20~35 $\mu$m on the both surfaces of the tape using a adhesive agent. Then, through holes 7 are bored where connections between the front surface and the rear surface are desired, and are subjected to plating, thereby to complete the conductive through holes. Photoetching is performed to form the sheet leads 51 and 52 on one of the surfaces, and to form the connection terminals 53, 54, 55, 56, 57 and 58, and the interconnection patterns 61, 62, 63 on both surfaces. Next, a resist film of a thickness of about 20 $\mu$m is formed to cover surface portions other than the connection terminals and the sheet leads which are formed of the metal foils, to achieve insulation treatment. Then, plating is done to form a layer of Au or Sn or Pb-Sn on the portions not subjected to the insulation treatment. The flexible tape 1 is made long. The above-mentioned operations are continuously achieved from one end to the other end of the tape 1.

Figure 1B:
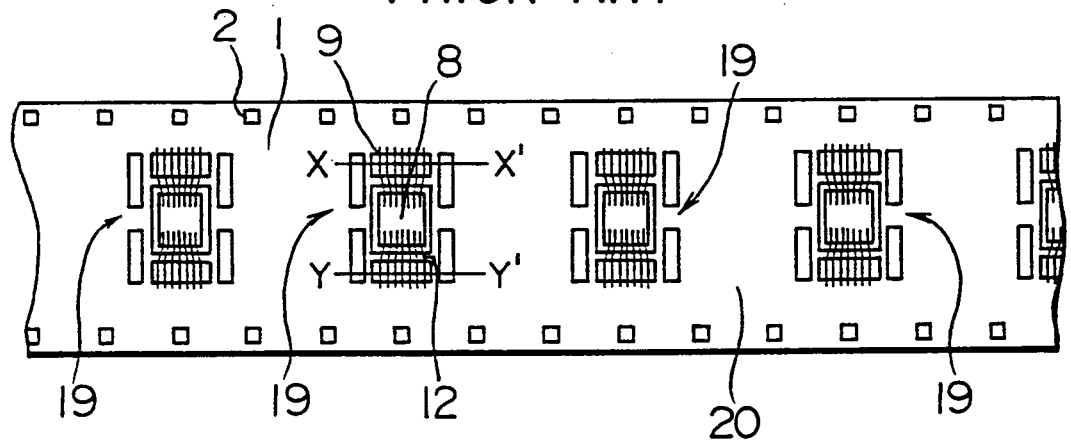
Figure 2:
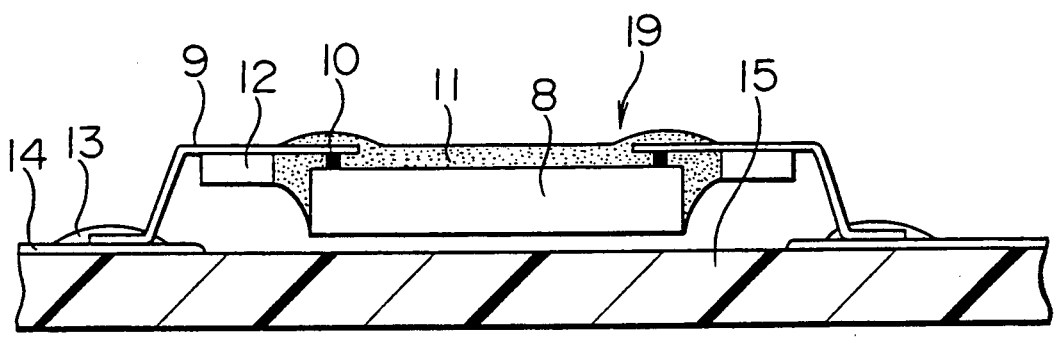
FIG. 2 is a cross-section illustrating the conventional packaging where the IC of FIGS. 1A and 1B is packaged on a printed circuit board.
Figure 3:
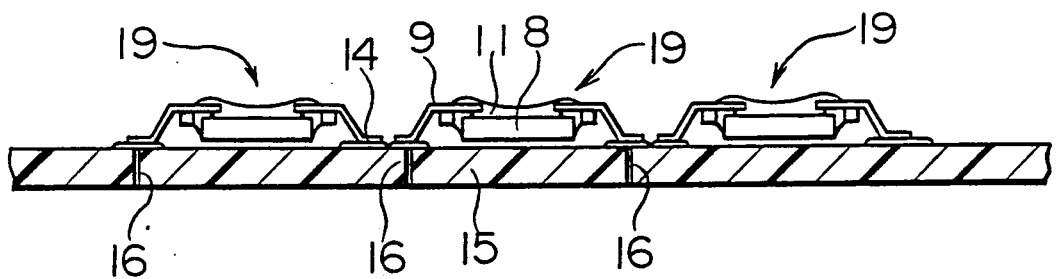
FIG. 3 is a cross-section of a conventional semiconductor device packaged on a printed circuit board.

Next, a predetermined number, e.g. two to four, of TAB-packaged memory IC devices 19 including IC chips of the same tape (FIG. 1B), which have been mounted on another tape carrier, subjected to inner lead bonding to the tape carrier by the TAB method and having the surfaces of the inner lead bonding covered with sealing resin 11, are cut out from that tape carrier and are outer-lead-bonded on the both surfaces of the flexible tape 1. FIG. 6 shows this state.

The TAB method, described above, is the well known Tape Auto Bonding method for IC chip in which protruding electrodes of an IC chip are connected to corresponding chip leads by thermal application in a carrier tape including patterns and chip leads formed on a flexible tape made of polyimide, glass epoxy resin, etc., and a surface of said IC chip is coated by a containment resin.

In FIG. 6, the relation of the chip leads 9 of the TAB-packaged memory IC devices 19 and the IC chips 8, on the front surface of the tape 1 is inverted on the rear surface of the tape 1. Namely, the connection states of the chip leads 9 are upside and downside on the front and the rear surfaces, respectively.

The connection of the respective memory IC devices 19 with the connection terminals of the flexible tape 1 may be done as follows. In case of a polyimide tape, connection with Au-Sn, Pb-Sn or connection using a conductive adhesive film may be done under 400° C. which is the withstand temperature of polyimide.

In this way, sheet modules 6, each carrying two to four memory IC devices, are taken from the flexible tape 1 which carries successive groups of TAB-packaged IC devices, each group including two to four IC devices, by successively cutting the tape at predetermined positions of the sheet leads 51 and 52, i.e. along line A—A' in FIG. 6.

The obtained sheet modules are outer-lead-bonded to the predetermined positions of the bonding terminals 14 of the printed circuit board 15 of FIG. 7. Thus, a high density package substrate is made in which memory IC devices 19 are packaged in multi-layer structure on one side of the printed circuit board 15. Even when a multiplicity of memory IC devices 19 are packaged, the sheet module 6 has pattern wirings and the pattern wiring on the printed circuit board 15 can be simplified due to the pattern wirings on the modules 6. As a result, even when two layers of IC arrangement are formed on the upper surface of the printed circuit board as described above, there may be needed no complicated wirings. Therefore, it is easy to make the substrate 15 itself in two layers.

FIG. 6 shows a case where four IC chips on each surface, i.e. a total of eight on both surfaces, are outer-lead-bonded to a long flexible tape 1. The number of IC chips may also be two or six or any other, and can be freely set.

The circuit board of FIG. 7 carries four sheet modules 6 on the front and the rear surfaces. Here, again the number of the sheet modules is not limited to the illustrated one.

In the printed circuit board 15, through holes 16 are formed, which may correspond to the through holes 7. The bonding terminals 14 formed on the front and the rear surfaces are connected through the through hole 16. The sheet leads 51 and 52 are connected with the respective bonding terminals 14. On the other end of the sheet module 6, i.e. opposite to the sheet leads 51 and 52, an adhesive resin layer 17 is provided to fix the other end of the sheet module by adhesion.

Selection of one sheet module from the pair of the upper and lower stacked sheet modules 6 and selection of one IC chip from the pair of the upper and lower stacked IC chips may be done in the following way. For example, regarding two specific terminals at different positions, each terminal is arranged to be connected to one of the modules or IC chips by some internal connection, and not to the other. Selection of one IC chip or one sheet module can be done by selecting one of these terminals. Also, there may be provided one lead for each side which is not in mirror relation. i.e. has no counterpart, and this terminal may be utilized as a selection terminal.

By so doing, a semiconductor device packaging multi-layered IC chips on each surface of the printed wiring board is provided.

In this embodiment, the sheet leads 51 and 52 are disposed on one side edge of the sheet module as shown in FIG. 4. The leads may also be disposed on two arbitrary side edges, or on three or four side edges. In these cases, the outer lead bonding to the printed wiring board can be easier.

As has been described, according to the above embodiment, a tape module is formed by mounting a plurality of memory IC chips on a film of a predetermined length using a tape. What carries a plurality of memory IC chips is not limited to the film. A plurality of memory IC devices may be mounted on a so-called one sheet-shaped member. It does not matter whether it is a tape or a film or something else. Further, the IC chips to be mounted are not limited to memory IC chips. Also, it is not necessary to mount IC devices on the both surfaces of printed wiring board nor on the both surfaces of the tape. Also, the IC devices mounted on a film may not be interconnected through the patterns.

Thus, since TAB-packaged IC devices are outer-lead-bonded to another carrier tape, sheet-shaped modules each carrying a plurality of IC devices, can be made, and these sheet modules can be bonded to a printed circuit board. Thus, higher density packaging on a same area as before is made possible. Memory devices which are compact and yet have large capacities can easily be manufactured.

When pattern wiring is made on the sheet-shaped module, simplification of the pattern wiring on the printed wiring board can be done. It is easy to form a multi-layer wiring board.

We claim:

1. A semiconductor device comprising:
    a wiring board, said wiring board including a first surface and a second surface and a plurality of terminals;
    at least one sheet module, said sheet module including a sheet, said sheet having a front surface and a back surface, a plurality of IC devices, each said IC device including an IC chip, a plurality of input chip leads bonded to said IC chip and a plurality of output chip leads bonded to said IC chip, a number greater than two of said IC devices being mounted on each said sheet, a plurality of connection terminals disposed on said sheet to correspond to said input chip leads and said output chip leads and a plurality of sheet leads, each said sheet lead being connected to at least one of said connection terminals at one end thereof and to one of said terminals of said wiring board at the other end thereof, a plurality of wirings patterns connected at least among said connection terminals corresponding to said input chip leads and said output chip leads and between said sheet leads and said connection terminals corresponding to said input chip leads and said output chip leads, some of said input chip leads and some of said output chip leads being bonded to at least some of said connection terminals to mount each said IC device on said sheet and to connect each said IC device to one of said terminals of said wiring board.

2. The semiconductor device according to claim 1, wherein at least one of said plurality of IC devices is mounted on said front surface and at least one of said plurality of IC devices is mounted on said back surface, and said sheet further including a plurality of through holes between said front and rear surfaces, each said through hole connecting an associated pair of said connection terminals on said front surface and said back surface.

3. The semiconductor device according to claim 2, wherein said plurality of IC devices include a plurality of memory IC chips of a single type, said memory IC chips being disposed in a layer on each of said front and back surfaces in a reflected image relationship.

4. The semiconductor device according to claim 3, wherein the number of said memory IC devices is an even number at least equal to four.

5. The semiconductor device according to claim 3, wherein a portion of the outer surface of each said memory IC chip, a portion of each said input chip lead and a portion of each said output chip lead are coated with resin.

6. The semiconductor device according to claim 1, wherein each said sheet is a film cut from a tape.

7. The semiconductor device according to claim 3, wherein each said sheet is a flexible tape made of a material selected from the group consisting of polyimide and glass epoxy resin, and having a thickness in a range of 18 μm to 125 μm.

8. The semiconductor device according to claim 1, wherein there are a plurality of sheet modules mounted on said first and said second surface of said wiring board, at least one of said plurality of terminals on said wiring board being disposed on each of said first and said second surfaces in a corresponding relationship, and said wiring board further including a plurality of through holes connecting said terminals in corresponding relationship.

* * * * *